United States Patent
Pal

(10) Patent No.: US 12,166,405 B2
(45) Date of Patent: Dec. 10, 2024

(54) POWER GENERATOR COOLING SYSTEM

(71) Applicant: Hamilton Sundstrand Corporation, Charlotte, NC (US)

(72) Inventor: Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 281 days.

(21) Appl. No.: 17/725,769

(22) Filed: Apr. 21, 2022

(65) Prior Publication Data

US 2023/0344310 A1  Oct. 26, 2023

(51) Int. Cl.
*H02K 9/19* (2006.01)
*H02K 5/20* (2006.01)
*H05K 7/20* (2006.01)

(52) U.S. Cl.
CPC ............... *H02K 9/19* (2013.01); *H02K 5/20* (2013.01); *H05K 7/20909* (2013.01); *H05K 7/20927* (2013.01)

(58) Field of Classification Search
CPC ........ H02K 9/19; H02K 5/20; H05K 7/20909; H05K 7/20927; B64D 27/24; B64D 33/08; B64D 41/00; F28D 1/024; F28D 2021/0021; F28D 2021/0031; F28D 1/0366; F28D 9/0093; F28D 9/0062; F28F 27/02
See application file for complete search history.

(56) References Cited

U.S. PATENT DOCUMENTS

| | | |
|---|---|---|
| 5,271,248 A | 12/1993 | Crowe |
| 8,616,015 B2 | 12/2013 | Amedick et al. |
| 9,332,671 B2 | 5/2016 | Schult et al. |
| 9,546,589 B2 | 1/2017 | Young et al. |
| 10,892,665 B2 | 1/2021 | Pal et al. |
| 2015/0233265 A1 | 8/2015 | Rohden |
| 2017/0081040 A1* | 3/2017 | Pal .................. F28F 9/026 |
| 2019/0010824 A1* | 1/2019 | Snyder .............. F01D 25/12 |
| 2019/0280564 A1* | 9/2019 | Pal .................. H05K 7/20254 |
| 2021/0352832 A1 | 11/2021 | Pal et al. |

(Continued)

FOREIGN PATENT DOCUMENTS

| | | |
|---|---|---|
| EP | 3144623 A2 | 3/2017 |
| EP | 3537578 A1 | 9/2019 |

OTHER PUBLICATIONS

European Search Report for European Application No. 23168483.8; dated Sep. 14, 2023; 57 pages.

(Continued)

*Primary Examiner* — Thomas Truong
(74) *Attorney, Agent, or Firm* — CANTOR COLBURN LLP

(57) ABSTRACT

A cooling system of a power generation system includes a generator cooling circuit having a first cooling fluid circulating therethrough. The generator cooling circuit includes a generator heat exchanger fluidly connected to a generator of the power generation system via the generator cooling circuit to cool the generator. A power converter cooling circuit has a second cooling fluid different from the first cooling fluid circulating therethrough. The power converter cooling circuit includes a power converter heat exchanger fluidly connected to a power converter of the power generation system via the power converter cooling circuit to cool the power converter.

16 Claims, 5 Drawing Sheets

(56) References Cited

U.S. PATENT DOCUMENTS

2022/0001997 A1 1/2022 Pal et al.
2023/0303263 A1* 9/2023 Schenk .................... H02K 7/14

OTHER PUBLICATIONS

Kilger; Heat Transfer Media: AtoZ; A to Z Guide to Thermodynamics, Heat & Mass Transfer, and Fluids Engineering; May 12, 2015; 2 pages.

* cited by examiner

POWER GENERATOR COOLING SYSTEM

BACKGROUND

Exemplary embodiments pertain to the art of power generation systems, and in particular those used in electric propulsion systems for, for example, aircraft.

Electric propulsion systems and other electrical systems for aircraft applications often require power conversion electronics integrated with electrical generators. This integration of power conversion electronics to the generator offers low volume and weight of the system. Cooling of such integrated system is typically done with coolant at a temperature which is desirable for generator cooling, in the range of for example 80 degrees Celsius to 105 degrees Celsius. Such high coolant temperature is, however, undesirable for power electronics cooling.

BRIEF DESCRIPTION

In one embodiment, a cooling system of a power generation system includes a generator cooling circuit having a first cooling fluid circulating therethrough. The generator cooling circuit includes a generator heat exchanger fluidly connected to a generator of the power generation system via the generator cooling circuit to cool the generator. A power converter cooling circuit has a second cooling fluid different from the first cooling fluid circulating therethrough. The power converter cooling circuit includes a power converter heat exchanger fluidly connected to a power converter of the power generation system via the power converter cooling circuit to cool the power converter.

Additionally or alternatively, in this or other embodiments the generator heat exchanger and the power converter heat exchanger are located in a common duct.

Additionally or alternatively, in this or other embodiments the power converter heat exchanger is positioned fluidly upstream of the generator heat exchanger relative to an airflow directed through the duct to remove thermal energy from the power converter heat exchanger and the generator heat exchanger.

Additionally or alternatively, in this or other embodiments the duct is configured such that the airflow directed through the duct first flows through the power converter heat exchanger and then through the generator heat exchanger.

Additionally or alternatively, in this or other embodiments a RAM air door is positioned in the duct to selectably direct a RAM airflow through the duct.

Additionally or alternatively, in this or other embodiments a fan is positioned in the duct to selectably direct the airflow from the fan through the duct.

Additionally or alternatively, in this or other embodiments one or more of the generator heat exchanger and the power converter heat exchanger are plate and fin heat exchangers.

Additionally or alternatively, in this or other embodiments the first cooling fluid is an oil.

Additionally or alternatively, in this or other embodiments the second cooling fluid is a refrigerant, or water glycol mixture.

Additionally or alternatively, in this or other embodiments the first cooling fluid is delivered to the generator at a first temperature, and the second cooling fluid is delivered to the power converter at a second temperature lower than the first temperature.

In another embodiment, a power generation system of an aircraft includes an electrical generator and a power converter operably connected to the electrical generator. The power generation system includes a cooling system including a generator cooling circuit having a first cooling fluid circulating therethrough. The generator cooling circuit includes a generator heat exchanger fluidly connected to the electrical via the generator cooling circuit to cool the electrical generator. A power converter cooling circuit has a second cooling fluid different from the first cooling fluid circulating therethrough. The power converter cooling circuit includes a power converter heat exchanger fluidly connected to the power converter via the power converter cooling circuit to cool the power converter.

Additionally or alternatively, in this or other embodiments the generator heat exchanger and the power converter heat exchanger are positioned in a common duct.

Additionally or alternatively, in this or other embodiments the power converter heat exchanger is positioned fluidly upstream of the generator heat exchanger relative to an airflow directed through the duct to remove thermal energy from the power converter heat exchanger and the generator heat exchanger.

Additionally or alternatively, in this or other embodiments the duct is configured such that the airflow directed through the duct first flows through the power converter heat exchanger and then through the generator heat exchanger.

Additionally or alternatively, in this or other embodiments a RAM air door is positioned in the duct to selectably direct a RAM airflow through the duct.

Additionally or alternatively, in this or other embodiments a fan is positioned in the duct to selectably direct the airflow from the fan through the duct.

Additionally or alternatively, in this or other embodiments one or more of the generator heat exchanger and the power converter heat exchanger are plate and fin heat exchangers.

Additionally or alternatively, in this or other embodiments the first cooling fluid is an oil.

Additionally or alternatively, in this or other embodiments the second cooling fluid is a refrigerant or water glycol mixture.

Additionally or alternatively, in this or other embodiments the first cooling fluid is delivered to the electrical generator at a first temperature, and the second cooling fluid is delivered to the power converter at a second temperature lower than the first temperature.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
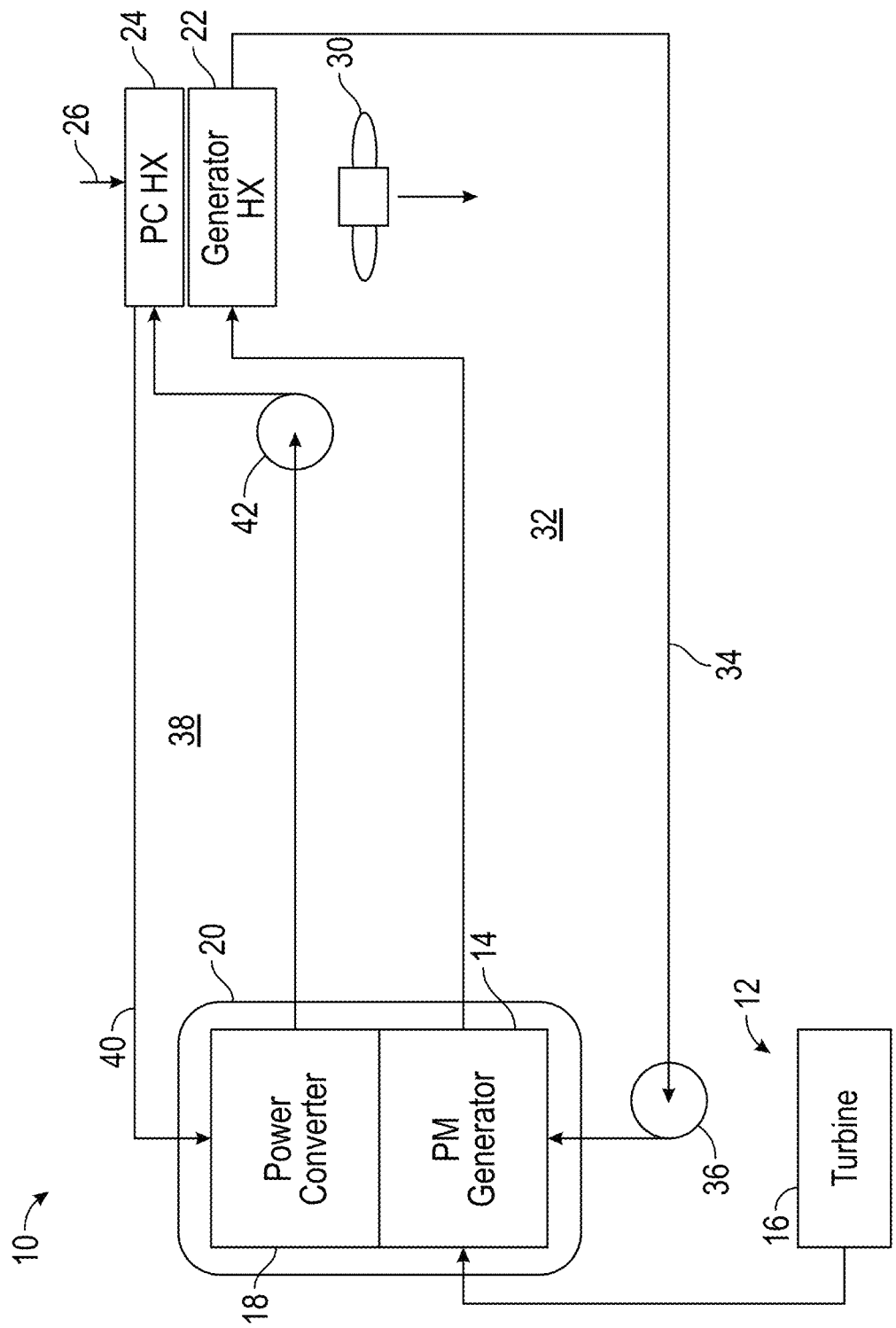
FIG. 1 is a schematic illustration of an embodiment of a cooling system for a power generation system.

Referring now to FIG. 1, an embodiment of a cooling system 10 for a combined power generation and power conversion apparatus 12 is illustrated. The apparatus 12 includes a generator 14, for example a permanent magnet generator. The generator 14 generates electrical energy from, for example rotational energy imparted on the generator 14 by, for example, a turbine 16 or other power source. A power converter 18, such as an active rectifier in one embodiment, which converts the electrical energy from the generator 14 into electrical power useful to one or more systems of the aircraft. The power converter 18 is connected to the generator 14, and in some embodiments is included in a common housing 20 with the generator 14 to define an integrated combined power generation and power conversion apparatus 12.

Figure 2:
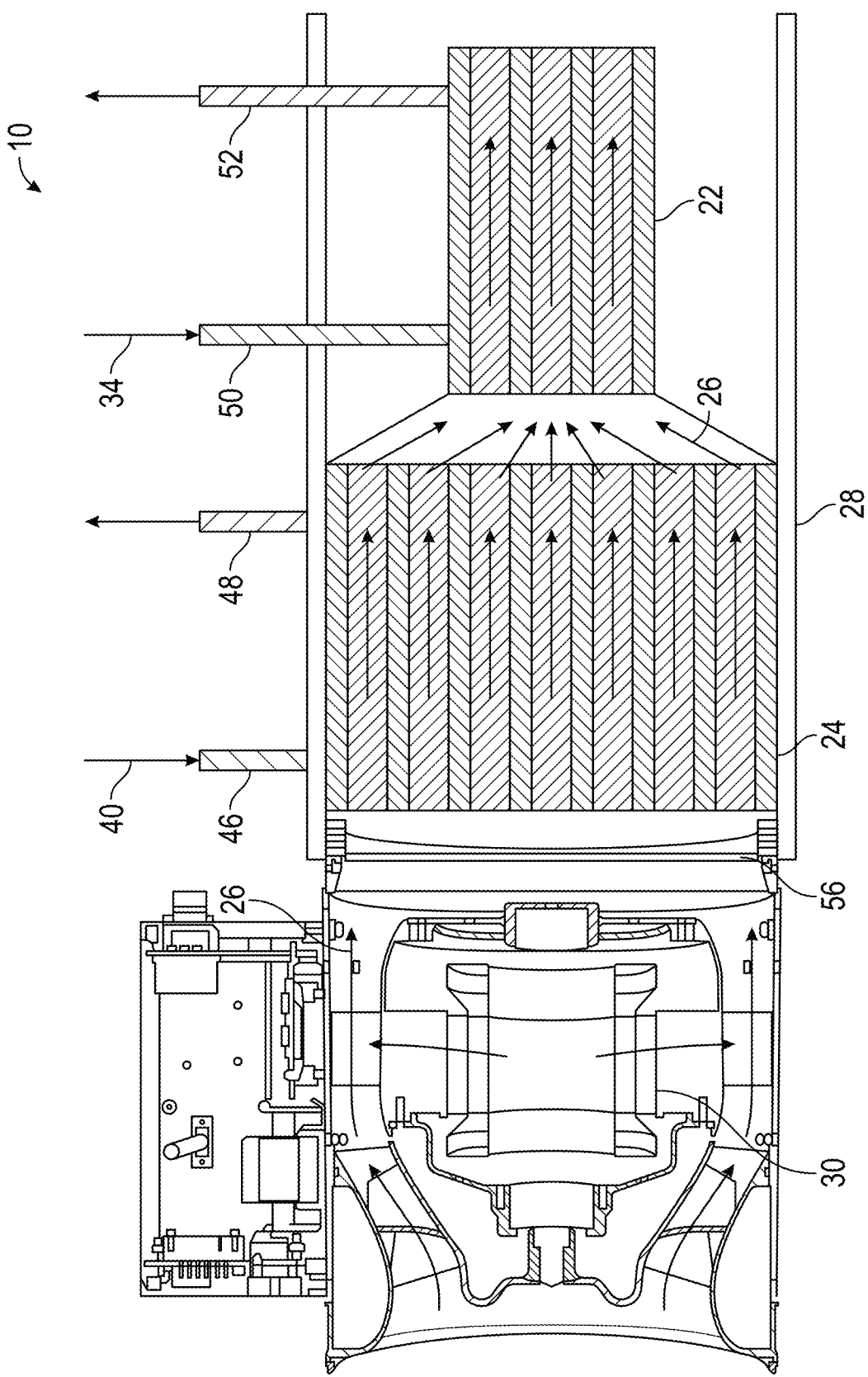
FIG. 2 is a partial cross-sectional view of an embodiment of a cooling system.

As shown in FIG. 1, the cooling system 10 is fluidly connected to the generator 14 and the power converter 18 to cool the generator 14 and the power converter 18. The cooling system 10 includes a generator heat exchanger 22 and a power converter heat exchanger 24 serially arranged such that an airflow 26 is directed first through the power converter heat exchanger 24 and then through the generator heat exchanger 22. In some embodiments, such as shown in FIG. 2, the power converter heat exchanger 24 and the generator heat exchanger 22 are arranged in a common duct 28 and a fan 30 urges the airflow 26 across the power converter heat exchanger 24 and the generator heat exchanger 22. Referring again to FIG. 1, a generator cooling circuit 32 is defined between the generator heat exchanger 22 and the generator 14, circulating a flow of generator coolant 34, such as oil, therethrough. The flow of generator coolant 34 is circulated through the generator cooling circuit 32 via a generator cooling pump 36. The flow of generator coolant 34 is directed toward the generator 14 and absorbs thermal energy from the generator 14. The flow of generator coolant 34 is then directed through the generator heat exchanger 22 where the thermal energy is rejected via the airflow 26. In some embodiments, the generator coolant 34 enters the generator 14 at an inlet temperature in the range of 85 to 95 degrees Celsius, and leaves the generator 14 at an exit temperature in the range of 100 to 115 degrees Celsius.

A power converter cooling circuit 38 is defined between the power converter heat exchanger 24 and the power converter 18, circulating a flow of power converter coolant 40, such as refrigerant, or a water based glycol coolant, therethrough. The flow of power converter coolant 40 is circulated through the power converter cooling circuit 38 via a power converter cooling pump 42. The flow of power converter coolant 40 is directed toward the power converter 18 and absorbs thermal energy from the power converter 18. The flow of power converter coolant 40 is then directed through the power converter heat exchanger 24 where the thermal energy is rejected via the airflow 26. In some embodiments, the power converter coolant 40 enters the power converter 18 at an inlet temperature in the range of 65 to 75 degrees Celsius, and leaves the power converter 18 at an exit temperature in the range of 80 to 90 degrees Celsius.

Referring now to FIG. 2, the cooling system 10 is further illustrated. The power converter heat exchanger 24 and the generator heat exchanger 22 are located in the duct 28, with the fan 30 located at an upstream end of the duct 28, relative to the direction of the airflow 26 along the duct 28. The power converter heat exchanger 24 is located upstream of the generator heat exchanger 22, due to the greater cooling requirements of the power converter heat exchanger 24. The power converter coolant 40 enters the power converter heat exchanger 24 at a power converter heat exchanger inlet 46 and exits the power converter heat exchanger 24 at a power converter heat exchanger outlet 48. Similarly, the generator coolant 34 enters the generator heat exchanger 22 at a generator heat exchanger inlet 50 and exits the generator heat exchanger 22 at a generator heat exchanger outlet 52. Cooling fan 30 can be placed either upstream or downstream of the heat exchangers.

Figure 3:
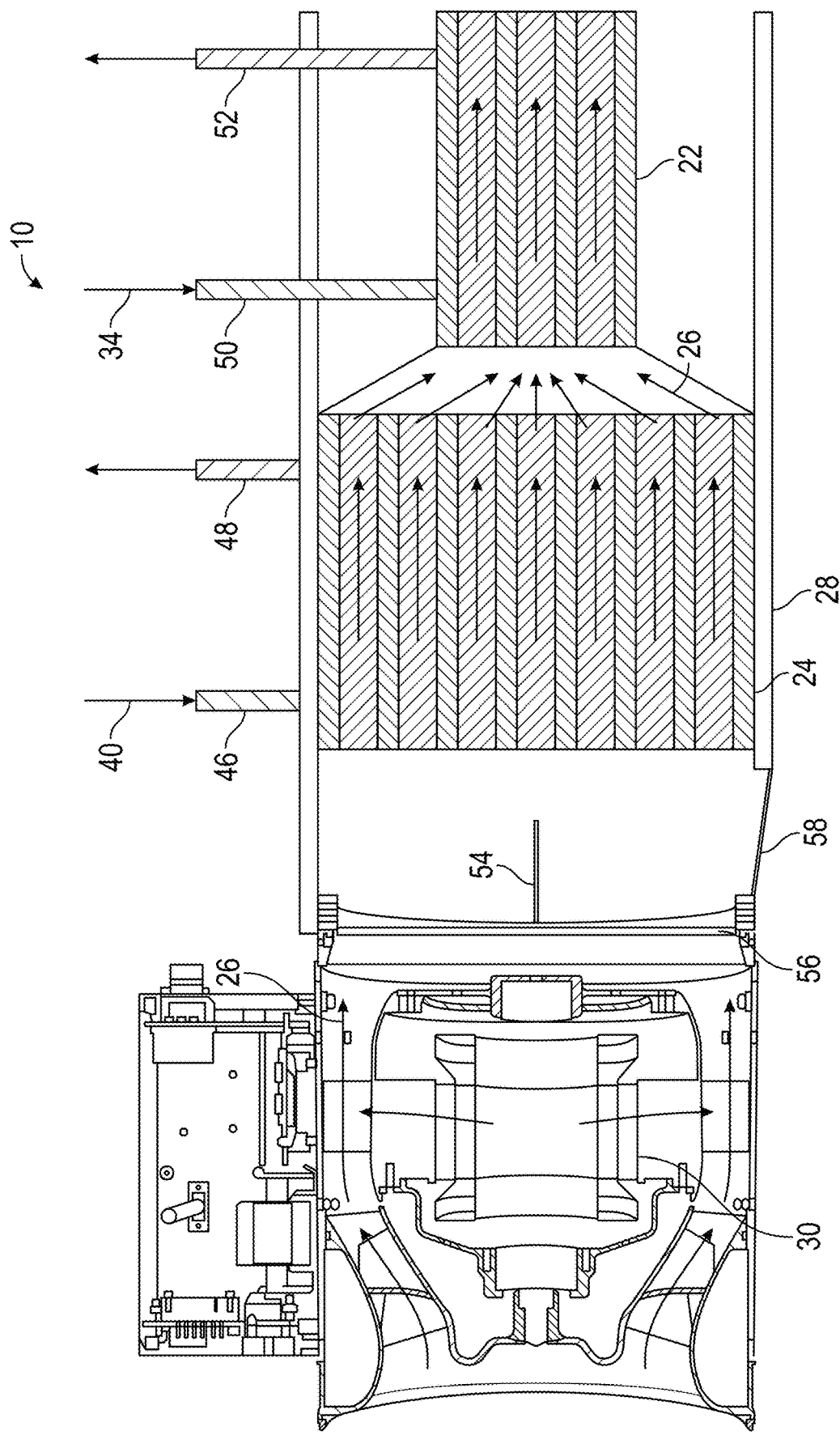
FIG. 3 is a partial cross-sectional view of an embodiment of a cooling system operated in a first mode.

Referring now to FIG. 3, in some embodiments, the cooling system 10 may be operated in multiple modes. The cooling system 10 includes a fan door 54 located at, for example, a fan outlet 56 of the fan 30, and a RAM air door 58 located in the duct 28 between the fan 30 and the power converter heat exchanger 24. In a first mode, as illustrated in FIG. 3, the RAM air door 58 is in the closed position, and the fan door 54 is in the opened position. In this mode, the fan 30 is operated to urge airflow 26 across the power converter heat exchanger 24 and the generator heat exchanger 22. This mode may be used when, for example, the aircraft is stationary on the ground.

Figure 4:
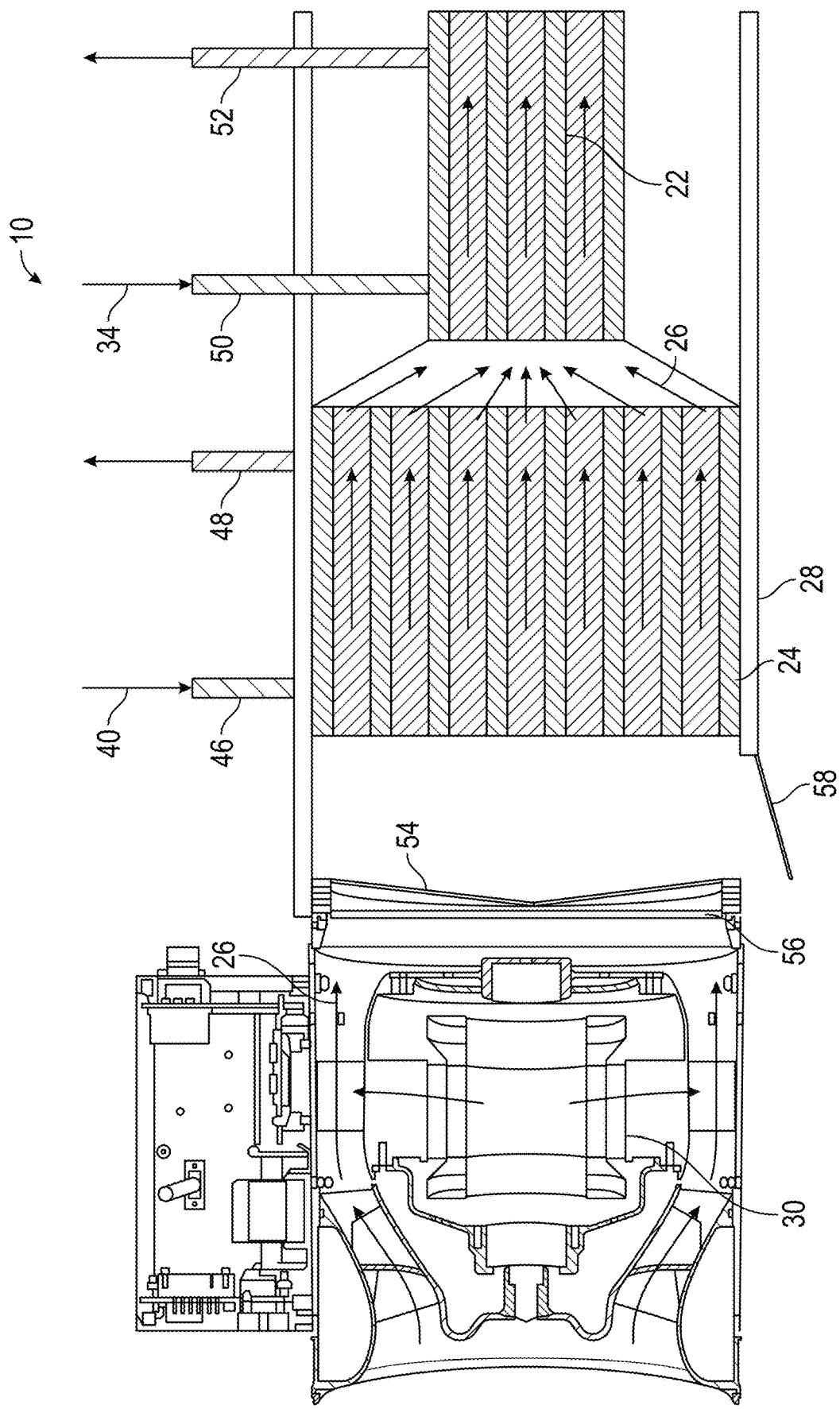
FIG. 4 is a partial cross-sectional view of an embodiment of a cooling system operated in a second mode.

In another mode, as illustrated in FIG. 4, the fan door 54 is in the closed position and the RAM air door 58 is in the opened position. In this mode, RAM airflow 26 is urged into the duct 44 through the RAM air door 58, and through the power converter heat exchanger 24 and the generator heat exchanger 22. This mode is used when, for example, the aircraft is in flight or otherwise when sufficient RAM airflow is present.

Figure 5:
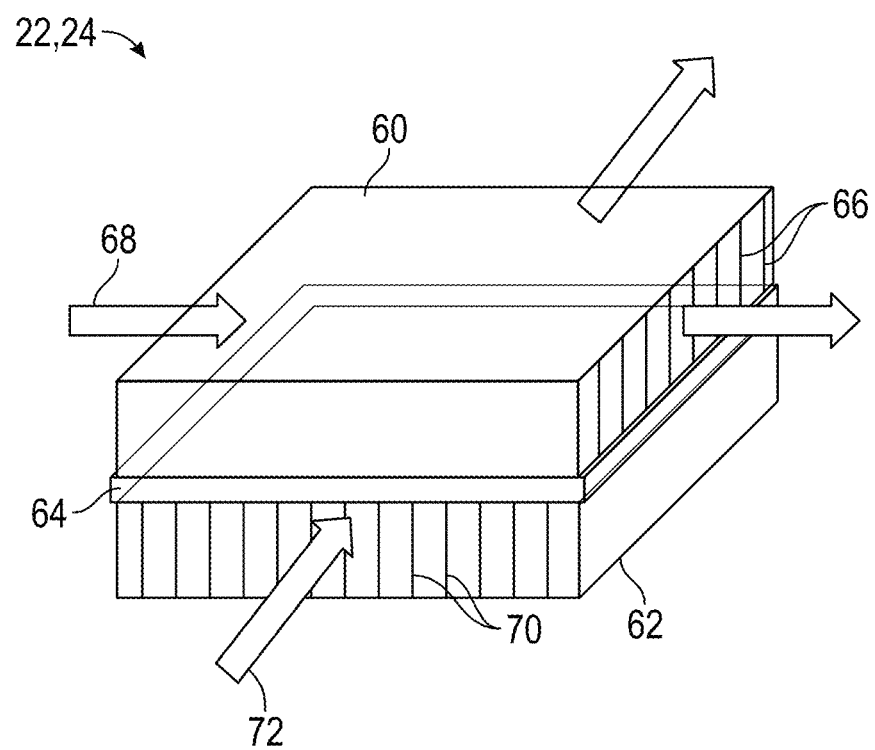
FIG. 5 is a partial view of an embodiment of a heat exchanger of a cooling system.

Referring to FIG. 5, in some embodiments the heat exchangers 22, 24 are plate and fin heat exchangers. This configuration includes an alternating stack of liquid flow layers 60 and air flow layers 62 separated by parting sheets 64. Each of the liquid flow layers 60 includes a plurality of liquid side fins 66 extending in a liquid flow direction 68 along the liquid flow layer 60. Similarly, the air flow layers 62 each include a plurality of air side fins 70 extending in the air flow direction 72 along the air flow layer 62. In an exemplary power converter heat exchanger 24, 12 liquid flow layers 60 are stacked with 12 air flow layers 62. Each of the liquid flow layers 60 have a fin pitch of 24 fins per inch, while the air flow layers 62 each have a fin pitch of 16 fins per inch. In an exemplary generator heat exchanger 22, 6 liquid flow layers 60 are stacked with 12 air flow layers 62. Each of the liquid flow layers 60 have a fin pitch of 24 fins per inch, while the air flow layers 62 each have a fin pitch of 16 fins per inch. Generally, due at least in part to the greater cooling requirements of the power converter 18 relative to the generator 14, the power converter heat exchanger 24 is larger and has thus greater airflow 26 therethrough, relative to the generator heat exchanger 22.

The configurations disclosed herein allows for improved cooling of the power converter 18, thus improving reliability of the power converter 18. Integration of the power converter heat exchanger 24 and the generator heat exchanger 22, which are each optimized to cool the power converter 18 and the generator, 14, respectively, allows for improved performance of the cooling system 10 and further providing a potential weight savings from the cooling system 10.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A cooling system of a power generation system, comprising:
   a generator cooling circuit having a first cooling fluid circulating therethrough, the generator cooling circuit including a generator heat exchanger fluidly connected to a generator of the power generation system via the generator cooling circuit to cool the generator;
   a power converter cooling circuit having a second cooling fluid different from the first cooling fluid circulating therethrough, the power converter cooling circuit including a power converter heat exchanger fluidly connected to a power converter of the power generation system via the power converter cooling circuit to cool the power converter; and
   a common duct in which the generator heat exchanger and the power converter heat exchanger are disposed;
   wherein the generator heat exchanger has a first heat exchanger height perpendicular to a direction of an airflow directed through the duct, and the power converter heat exchanger has a second heat exchanger height perpendicular to the direction of the airflow, the second heat exchanger height different from the first heat exchanger height.

2. The cooling system of claim 1, wherein the power converter heat exchanger is positioned fluidly upstream of the generator heat exchanger relative to the airflow directed through the duct to remove thermal energy from the power converter heat exchanger and the generator heat exchanger.

3. The cooling system of claim 1, wherein the duct is configured such that the airflow directed through the duct first flows through the power converter heat exchanger and then through the generator heat exchanger.

4. The cooling system of claim 1, further comprising a RAM air door positioned in the duct to selectably direct a RAM airflow through the duct.

5. The cooling system of claim 1, further comprising a fan positioned in the duct to selectably direct the airflow from the fan through the duct.

6. The cooling system of claim 1, wherein one or more of the generator heat exchanger and the power converter heat exchanger are plate and fin heat exchangers.

7. The cooling system of claim 1, wherein the first cooling fluid is an oil.

8. The cooling system of claim 1, wherein the second cooling fluid is a refrigerant, or water glycol mixture.

9. The cooling system of claim 1, wherein the first cooling fluid is delivered to the generator at a first temperature, and the second cooling fluid is delivered to the power converter at a second temperature lower than the first temperature.

10. A power generation system of an aircraft, comprising:
    an electrical generator;
    a power converter operably connected to the electrical generator; and
    a cooling system, including:
      a generator cooling circuit having a first cooling fluid circulating therethrough, the generator cooling circuit including a generator heat exchanger fluidly connected to the electrical generator via the generator cooling circuit to cool the electrical generator;
      a power converter cooling circuit having a second cooling fluid different from the first cooling fluid circulating therethrough, the power converter cooling circuit including a power converter heat exchanger fluidly connected to the power converter via the power converter cooling circuit to cool the power converter; and
      a common duct in which the generator heat exchanger and the power converter heat exchanger are disposed;
      a ram air door positioned in the duct to selectably direct a RAM airflow through the duct;
      a fan positioned in the duct to selectably direct the airflow from the fan through the duct; and
      a fan door positioned in the duct to control the airflow exiting the fan.

11. The power generation system of claim 10, wherein the power converter heat exchanger is positioned fluidly upstream of the generator heat exchanger relative to the airflow directed through the duct to remove thermal energy from the power converter heat exchanger and the generator heat exchanger.

12. The power generation system of claim 10, wherein the duct is configured such that the airflow directed through the duct first flows through the power converter heat exchanger and then through the generator heat exchanger.

13. The power generation system of claim 10, wherein one or more of the generator heat exchanger and the power converter heat exchanger are plate and fin heat exchangers.

14. The power generation system of claim 10, wherein the first cooling fluid is an oil.

15. The power generation system of claim 10, wherein the second cooling fluid is a refrigerant or water glycol mixture.

16. The power generation system of claim 10, wherein the first cooling fluid is delivered to the electrical generator at a first temperature, and the second cooling fluid is delivered to the power converter at a second temperature lower than the first temperature.

* * * * *